(12) United States Patent
Wu et al.

(10) Patent No.: US 7,402,510 B2
(45) Date of Patent: Jul. 22, 2008

(54) ETCHANT AND METHOD FOR FORMING BUMPS

(75) Inventors: En-Chieh Wu, Kao-Hsiung Hsien (TW);
Hiew Watt Ng, Kao-Hsiung (TW);
Hui-Hung Chen, Kao-Hsiung (TW);
Chi-Long Tsai, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 14 days.

(21) Appl. No.: 11/462,720

(22) Filed: Aug. 7, 2006

(65) Prior Publication Data

US 2007/0087546 A1    Apr. 19, 2007

(30) Foreign Application Priority Data

Oct. 13, 2005    (TW) .............................. 94135717 A

(51) Int. Cl.
*H01L 21/44*    (2006.01)
(52) U.S. Cl. ......................................... 438/613; 438/8

(58) Field of Classification Search ................. 438/612, 438/613, 8; 257/E23.021, E23.033, E23.068, 257/E21.508
See application file for complete search history.

(56) References Cited

U.S. PATENT DOCUMENTS

| 2003/0157792 A1* | 8/2003 | Tong et al. ................... 438/614 |
| 2004/0072416 A1* | 4/2004 | Fay ............................. 438/614 |

* cited by examiner

*Primary Examiner*—Thao P. Le
(74) *Attorney, Agent, or Firm*—Winston Hsu

(57) ABSTRACT

A method for forming bumps is disclosed. First, a substrate having an adhesive, a barrier, and a wetting layer thereon is provided. Next, a patterned photoresist is formed on the wetting layer, in which the patterned photoresist includes at least one opening for exposing a portion of the wetting layer. Next, a solder is deposited in the opening, and a stripping process is performed to remove the patterned photoresist. Next, a first etchant is utilized to perform a first etching process for etching a portion of the wetting and barrier layers by utilizing the solder as a mask, in which the first etchant is selected from the group consisting of: sulfuric acid, phosphoric acid, ferric chloride, ammonium persulfate, and potassium monopersulfate. Next, a second etchant is utilized to perform a second etching process removing a portion of the adhesive layer, and a reflow process is performed to form a bump.

16 Claims, 12 Drawing Sheets

ETCHANT AND METHOD FOR FORMING BUMPS

BACKGROUND OF THE INVENTION

1. Field of the Invention

The present invention relates to a method for forming bumps.

2. Description of the Prior Art

Flip-chip packaging processes are one of the most popular electronic packaging processes utilized today. In contrast to the some other packaging processes, the dies utilized in flip-chip packaging are not electrically connected to a packaging substrate via a bonding pad through a wire bonding process. Instead, the bonding pads are inverted and solder bumps are utilized to electrically connect and mount the dies onto the packaging substrate. Ideally, flip-chip packaging processes are able to achieve two important results. First, flip-chip packaging processes significantly reduce the size of package structures. Additionally, the flip-chip packaging processes are able to increase the circuit transmission between the dies and the packaging substrate. Said increase is possible because no extra wires are required for establishing a connection.

Please refer to FIG. 1 through FIG. 6. FIG. 1 through FIG. 6 are perspective diagrams showing the means of fabricating bumps 10 according to the prior art. As shown in FIG. 1, a substrate 12, such as a wafer having completed internal devices and wirings, is first provided. Next, a patterned passivation layer 14 is disposed on the surface of the substrate 12 to expose a plurality of bonding pads 16. Preferably, the bonding pads 16 are composed of copper or aluminum and utilized to electrically connect the internal wires (not shown) within the substrate 12 and the external wires (not shown) located above the packaging substrate.

Next, as shown in FIG. 2, a series of sputtering, deposition, and etching process are performed to form an under bump metallurgy layer 18 on each of the bonding pads 16 and the passivation layer 14. The under bump metallurgy layer 18 is composed of an adhesive layer 11, a barrier layer 13, and a wetting layer 15. The adhesive layer 11 functions to provide adequate adhesiveness for the bonding pads 16 and the patterned passivation layer 14, in which the adhesive layer 11 is selected from the group consisting of: aluminum, titanium, chromium, and titanium tungsten. The barrier layer 13 functions to prevent a diffusion phenomenon from occurring between the solder balls and the bonding pad, in which the barrier layer 13 is selected from the group consisting of: nickel and nickel vanadium. The wetting layer 15 functions to provide adequate adhesiveness between the under bump metallurgy layer 18 and the solder balls formed afterwards, in which the wetting layer 15 is selected from the group consisting of: copper, molybdenum, and platinum.

As shown in FIG. 3, a photoresist 20 is formed on the substrate 12 and the photoresist 20 is covering the passivation layer 14 and the under bump metallurgy layer 18. Preferably, the photoresist 20 is composed of a dry film photoresist or a liquid type photoresist. Next, as shown in FIG. 4, an exposure process and a development process are performed to pattern the photoresist 20 and form a plurality of openings 22 within the photoresist 20, in which the openings 22 expose the under bump metallurgy layer 18 above the bonding pads 16. Next, an electroplating process is performed to deposit a solder 24 in the openings 22. The solder may be composed of tin or copper.

After the photoresist 20 is stripped, as shown in FIG. 5, an etching process is performed by utilizing an etchant composed of nitric acid, acetic acid, hydrogen peroxide, hydrochloric acid, and sulfuric acid. Utilizing the solder 24 as a mask, the etching process removes a portion of the under bump metallurgy layer 18. Next, as shown in FIG. 6, a reflow process is performed to form a plurality of bumps 10 on the corresponding bonding pads 16. The reflow process thus completes the conventional method of fabricating bumps.

However, the etching selectivity from the etchant composed of nitric acid, acetic acid, hydrogen peroxide, hydrochloric acid, and sulfuric acid causes problems, specifically, due to the influence of the etching selectivity, the conventional process will often corrode the tin solder 24 while etching a portion of the under bump metallurgy layer 18. Additionally, the conventional process also results in damage to the adhesive layer 11 of the under bump metallurgy layer 18 and causes an undercut phenomenon. The undercut phenomenon thereby results in the creation of a plurality of undercut holes 26 having different sizes. Due to the undercut holes 26 and the side effects caused by the etchant, the solder 24 deposited into the openings 22 will transform into a plurality of uneven bumps 10 or result in a composition shift of the bumps. Ultimately, these problems and issues related to the conventional method negatively affect the overall yield and stability of the fabrication process. Hence, finding a method to effectively prevent the solder from being damaged while improve the conventional undercut phenomenon has become a critical research task.

SUMMARY OF THE INVENTION

It is therefore an objective of the present invention to provide a method for forming bumps for solving the aforementioned problems.

First, a substrate having an adhesive layer, a barrier layer, and a wetting layer thereon is provided. Next, a patterned photoresist is formed on the wetting layer, in which the patterned photoresist includes at least one opening for exposing a portion of the wetting layer. Next, a solder is deposited in the opening, and a stripping process is performed to remove the patterned photoresist. Next, a first etchant is utilized to perform a first etching process for etching a portion of the wetting layer and the barrier layer by utilizing the solder as a mask. Preferably, the first etchant is selected from a group consisting of sulfuric acid, phosphoric acid, ferric chloride, and ammonium persulfate, or a group consisting of sulfuric acid, phosphoric acid, ferric chloride, and potassium monopersulfate. Next, a second etchant is utilized to perform a second etching process and remove a portion of the adhesive layer, and a reflow process is performed to form a bump.

Specifically, the present invention first utilizes a first etchant composed of sulfuric acid, phosphoric acid, ferric chloride, and ammonium persulfate, or a first etchant composed of sulfuric acid, phosphoric acid, ferric chloride, and potassium monopersulfate to remove a portion of the wetting layer and the barrier layer of the under bump metallurgy layer, and then utilizes a second etchant composed of sulfuric acid and deionized water to remove a portion of the adhesive layer. Thereby, the adhesive layer, barrier layer, and wetting layer of the under bump metallurgy layer can be etched evenly through an adequate etching selectivity. Additionally, the undercut phenomenon caused by using the conventional etchant, which is composed of nitric acid, acetic acid, hydrogen peroxide, hydrochloric acid, and sulfuric acid, to etch the under bump metallurgy layer is also prevented.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
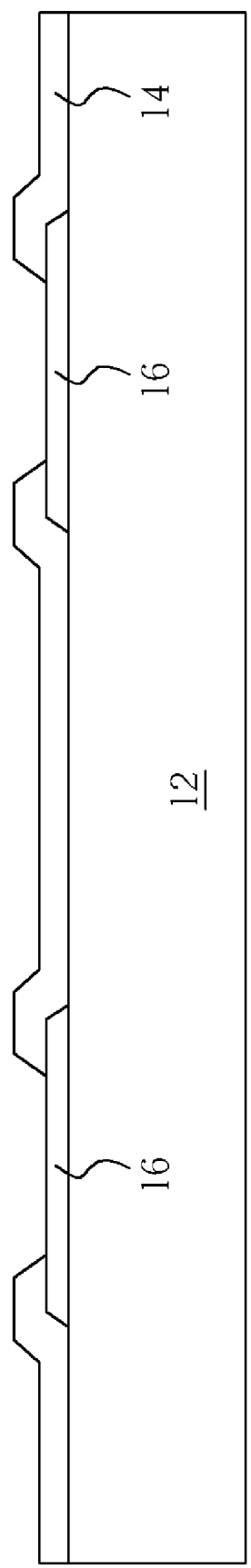
FIG. 1 through FIG. 6 are perspective diagrams showing the means of fabricating bumps 10 according to the prior art.
Figure 2:
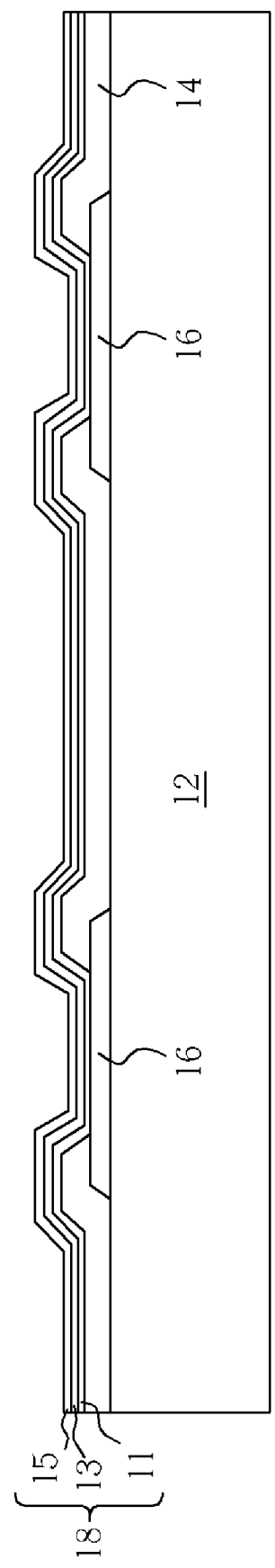
Figure 3:
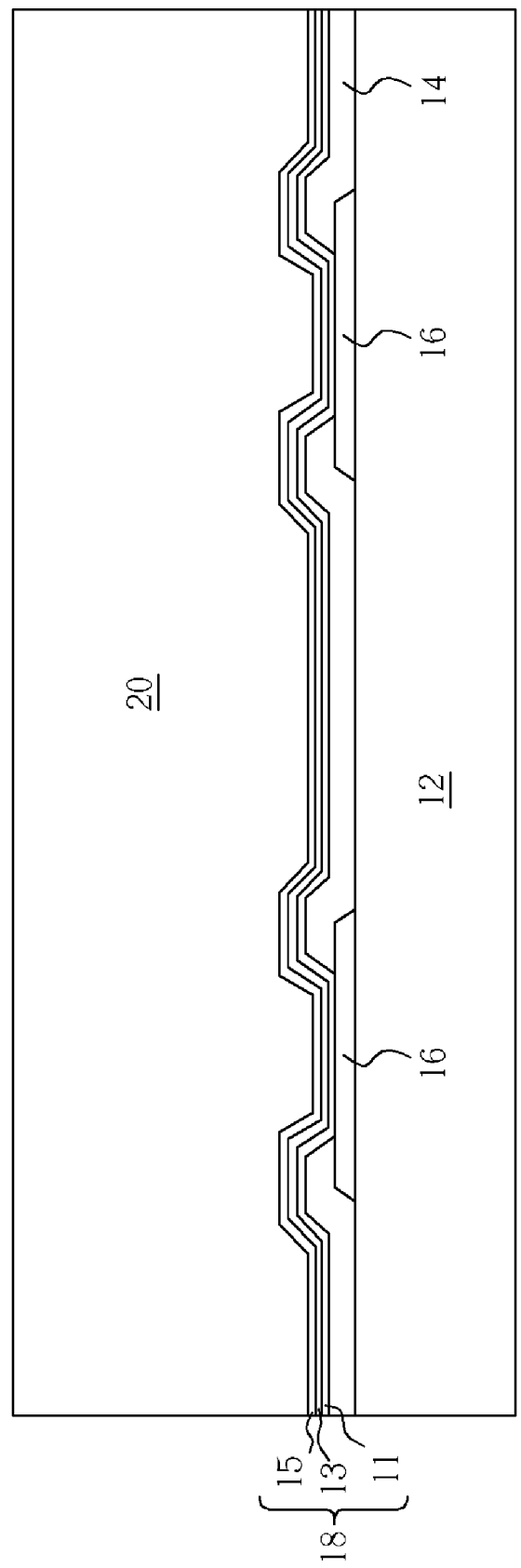
Figure 4:
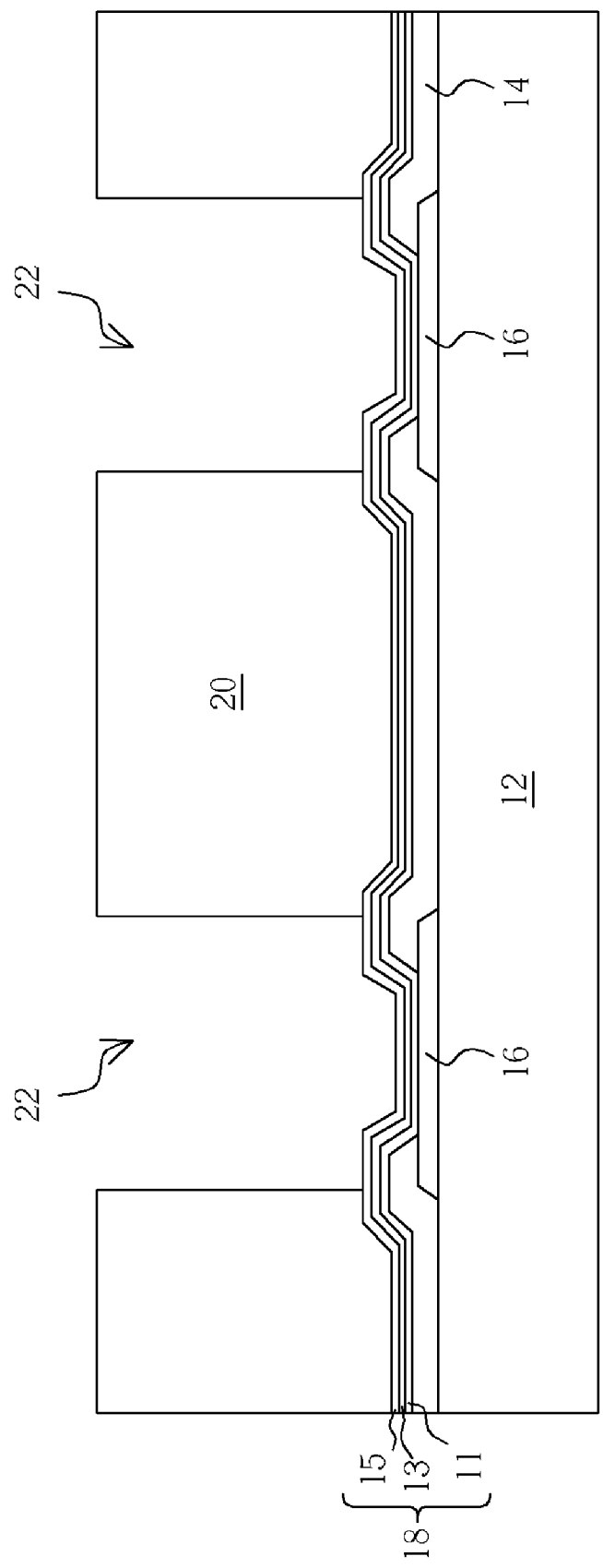
Figure 5:
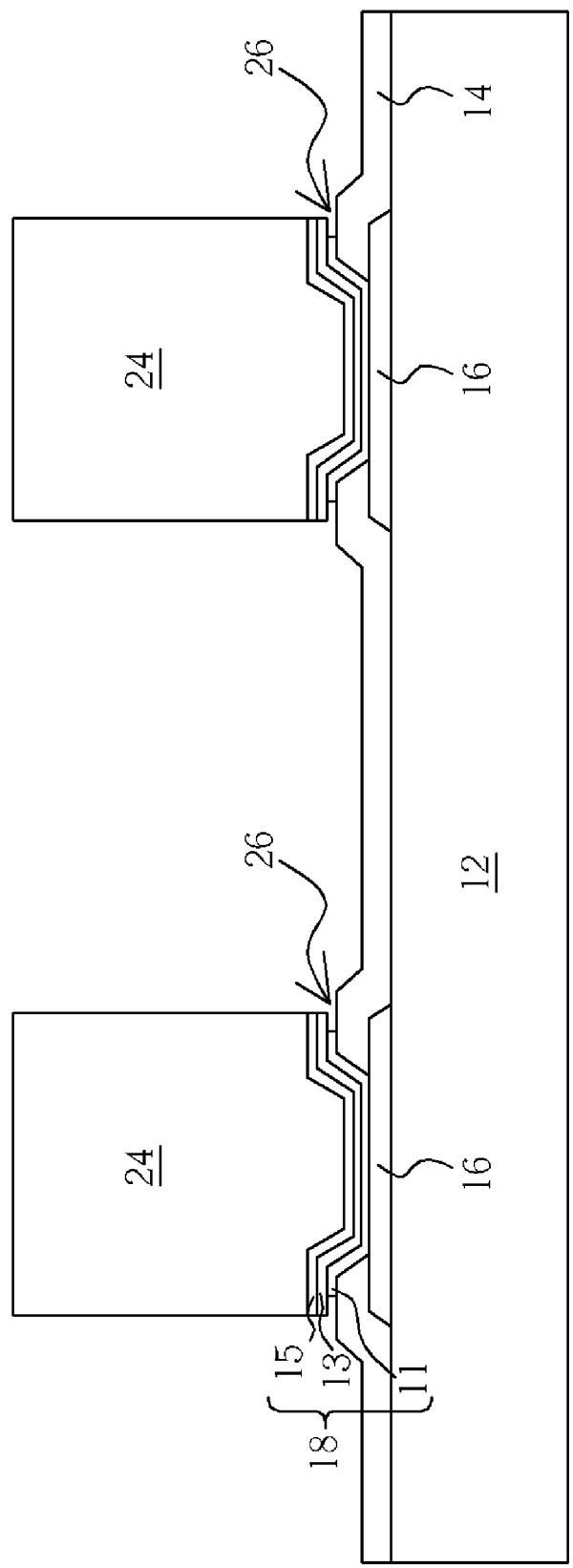
Figure 6:
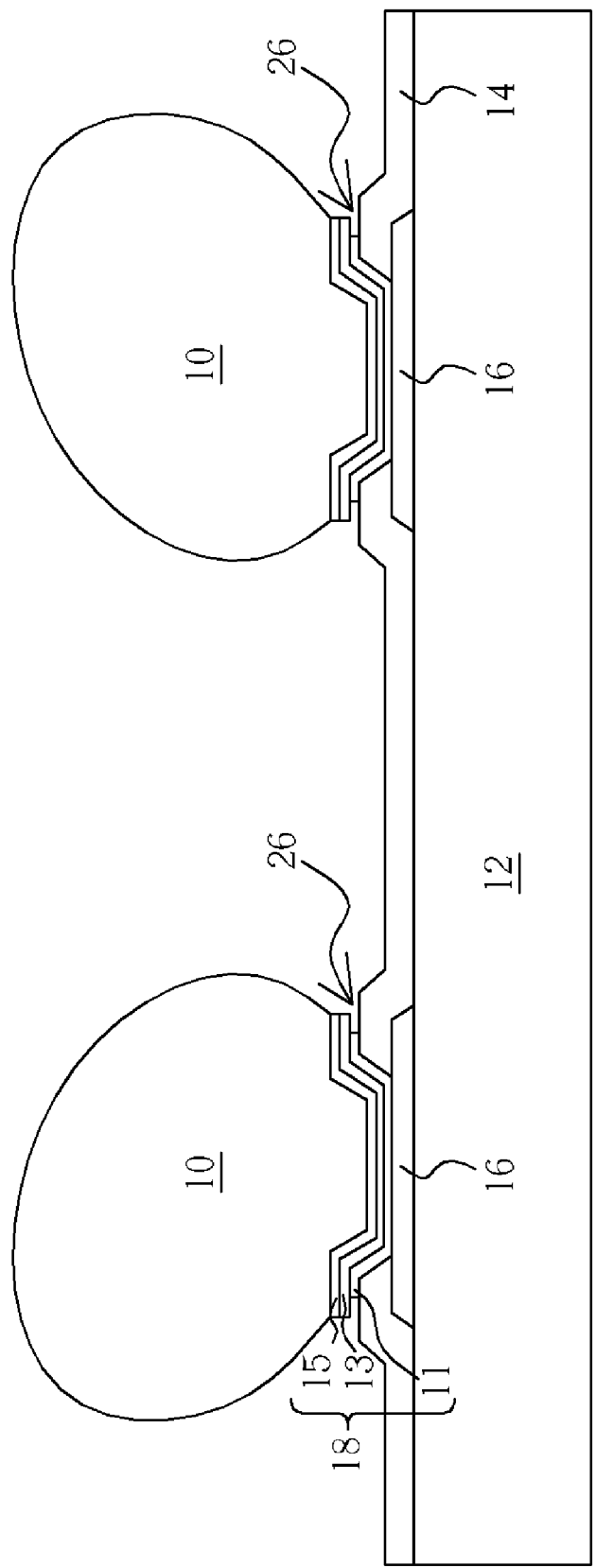
Figure 7:
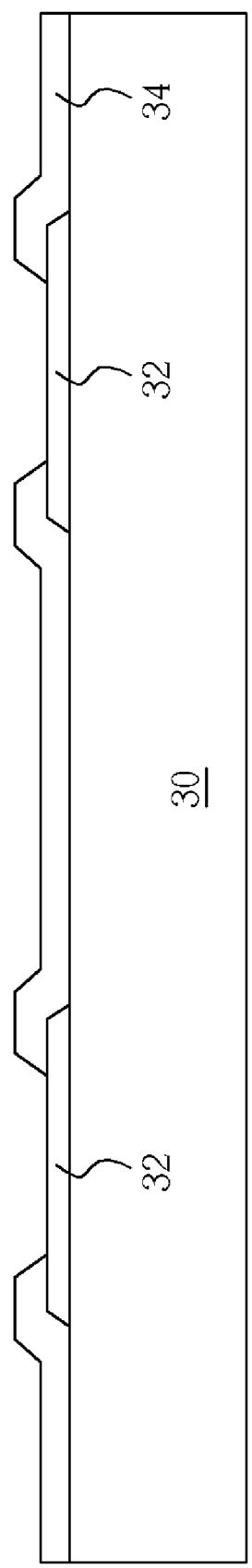
FIG. 7 through FIG. 12 are perspective diagrams showing a method of forming a bump according to the preferred embodiment of the present invention.

Please refer to FIG. 7 through FIG. 12. FIG. 7 through FIG. 12 are perspective diagrams showing a method of forming a bump 48 according to the preferred embodiment of the present invention. As shown in FIG. 7, a substrate 30, such as a wafer having embedded devices and circuits is provided. The surface of the substrate 30 also includes a plurality of conductive structures, such as a plurality of bonding pads 32. Composed of copper or aluminum, the bonding pads 32 are electrically connected to circuits (not shown) embedded within the substrate 30 and external circuits (not shown) formed on a packaging substrate. Next, a patterned passivation layer 34 is disposed on the substrate 30 and exposes a portion of the bonding pads 32. The patterned passivation layer 34 serves to protect the internal circuits (not shown) of the substrate 30.

Figure 8:
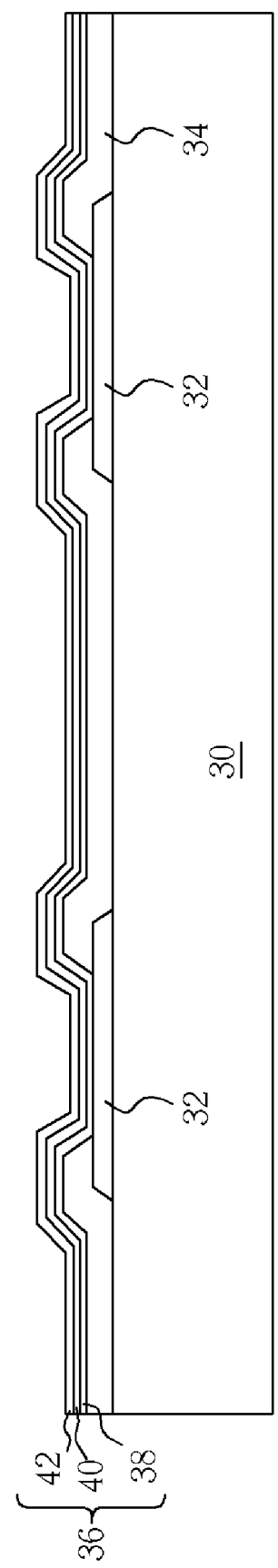

As shown in FIG. 8, a series of sputtering processes, deposition, and etching processes are performed to form an under bump metallurgy layer 36 composed of multiple stacked layers on the exposed bonding pads 32 and the patterned passivation layer 34. The under bump metallurgy layer 36 is composed of an adhesive layer 38, a barrier layer 40, and a wetting layer 42. The adhesive layer 38 functions to provide adequate adhesiveness for the bonding pads 32 and the patterned passivation layer 34, in which the adhesive layer 38 is selected from the group consisting of aluminum, titanium, chromium, and titanium tungsten. The barrier layer 40 functions to prevent a diffusion phenomenon between the solder ball and the bonding pad, in which the barrier layer 40 is selected from the group consisting of: nickel and nickel vanadium. The wetting layer 42 functions to provide adequate adhesiveness between the under bump metallurgy layer 36 and the solder balls formed afterwards, in which the wetting layer 42 is selected from the group consisting of: copper, molybdenum, and platinum.

Figure 9:
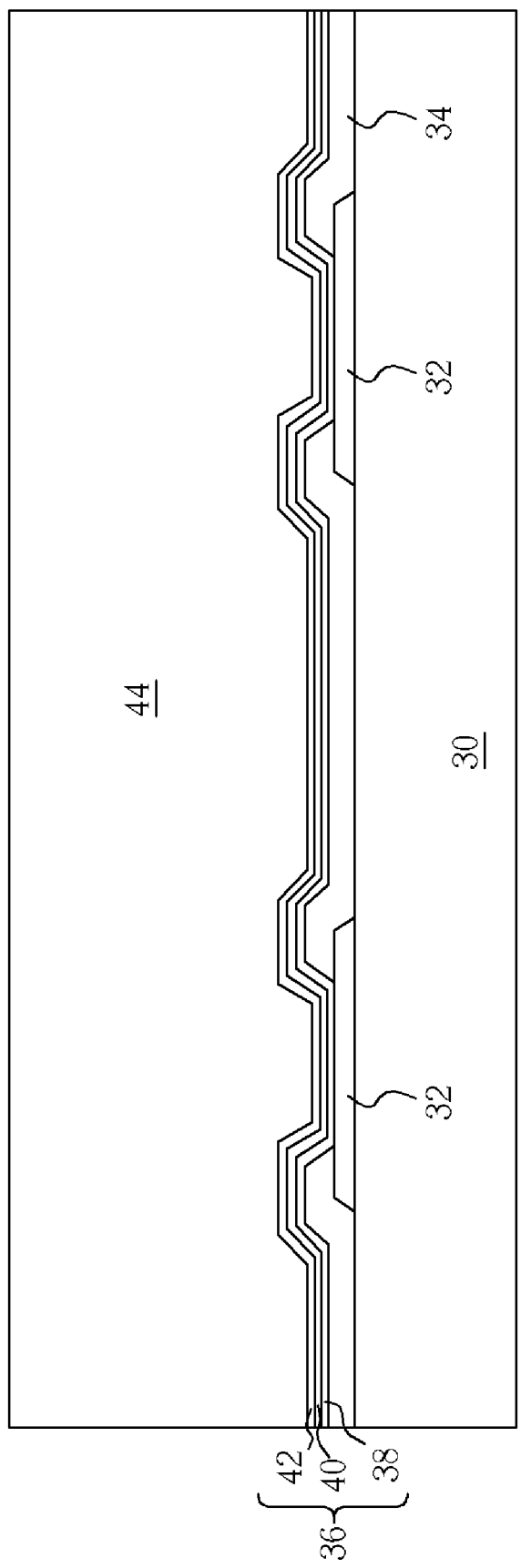
Figure 10:
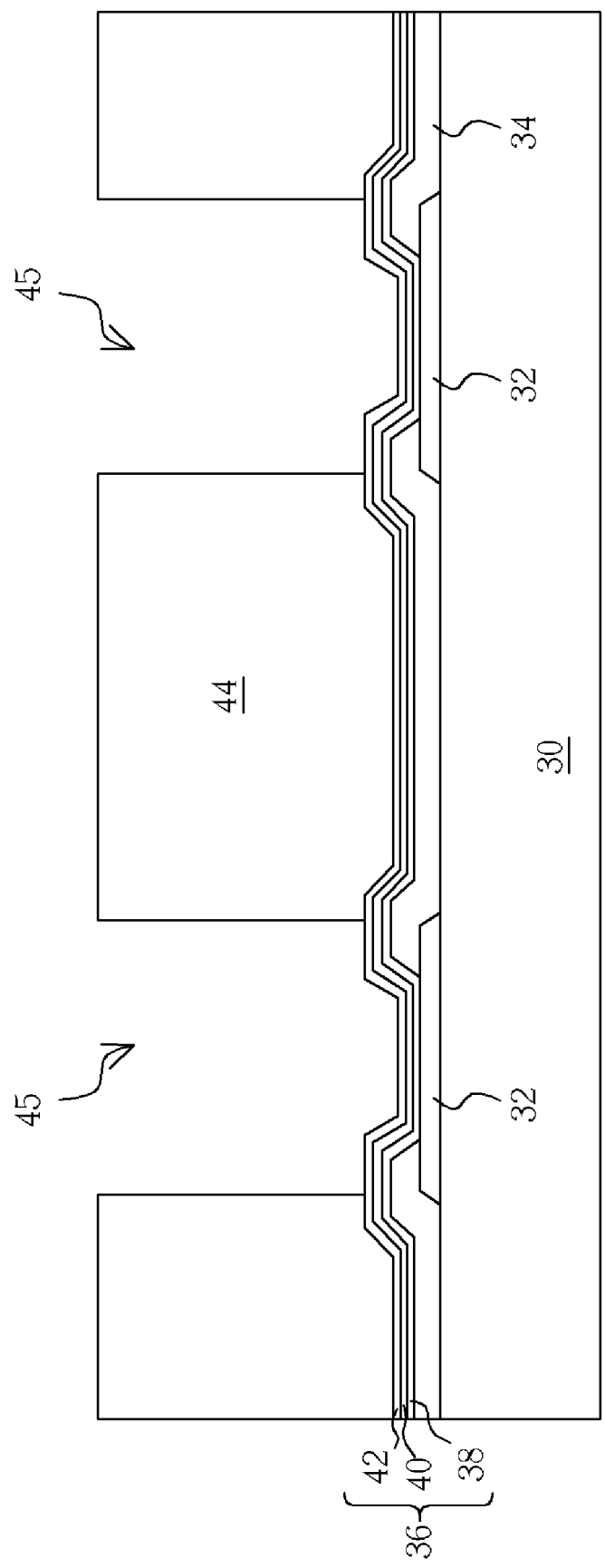

As shown in FIG. 9, a photoresist 44 is disposed on the under bump metallurgy layer 36, in which the photoresist 44 may be selected from a liquid phase photoresist or a dry film photoresist. As shown in FIG. 10, an exposure and development process is performed to pattern the photoresist 44. Subsequently, the patterned photoresist 44 will form a plurality of openings 45 to expose a portion of the under bump metallurgy layer 36 on the bonding pads 32. The openings 45 serve as an integration region between the solder disposed afterwards and the under bump metallurgy layer 36, hence the height of the opening is directly related to the height of the bump formed in the later process. According to the preferred embodiment of the present invention, the openings 45 are located directly above the bonding pads 32. Alternatively, depending on the design and demand of the fabrication specifications, a repeat distribution layer (RDL) process can be performed to form the openings 45 adjacent to the bonding pads 32 and above the under bump metallurgy layer 36.

Figure 11:
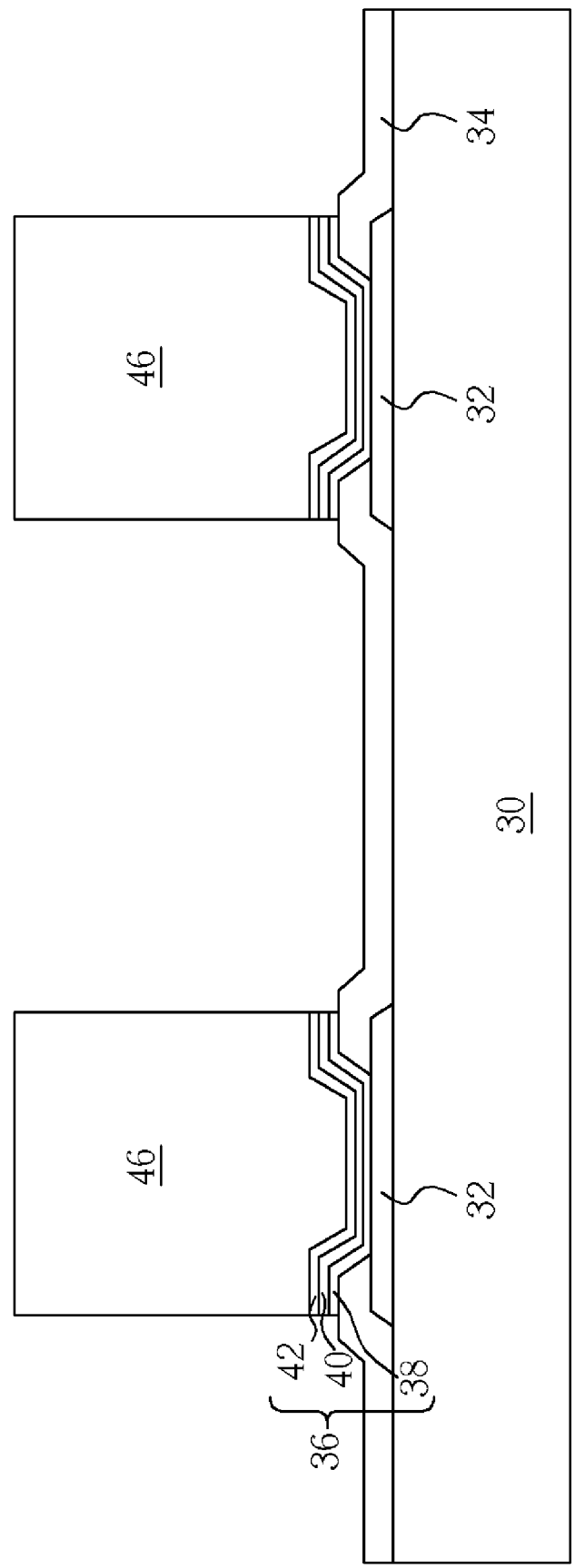

As shown in FIG. 11, an electroplating process is performed to deposit a solder 46 in the openings 45, in which the solder 46 may be composed tin or copper. Next, a stripping process is performed to remove the photoresist 44. Next, a first etchant is utilized to perform a first etching process for etching a portion of the wetting layer 42 and barrier layer 40 under the under bump metallurgy layer 36 by utilizing the solder 46 as a mask. The first etchant is selected from a group consisting of sulfuric acid, phosphoric acid, ferric chloride, and ammonium persulfate, or a group consisting of sulfuric acid, phosphoric acid, ferric chloride, and potassium monopersulfate. Next, a second etchant is utilized to perform a second etching process for removing a portion of the adhesive layer 38. The second etchant is composed of sulfuric acid and deionized water.

By utilizing a first etchant composed of sulfuric acid, phosphoric acid, ferric chloride, and ammonium persulfate, or a first etchant composed of sulfuric acid, phosphoric acid, ferric chloride, and potassium monopersulfate to remove a portion of the wetting layer 42 and the barrier layer 40, and then utilizing a second etchant composed of sulfuric acid and deionized water to remove a portion of the adhesive layer 38, the present invention is able to evenly etch the adhesive layer 38, barrier layer 40, and wetting layer 42, which are utilized to form the under bump metallurgy layer 36. Hence, the present invention is able to prevent the undercut phenomenon caused by excessive etching of the adhesive layer 38 by the conventional etchant, in which the conventional etchant is composed of nitric acid, acetic acid, hydrogen peroxide, hydrochloric acid, and sulfuric acid. Additionally, when the solder 46 deposited into the openings 45 is composed of tin, the etching process performed by utilizing the first etchant and second etchant of the present invention also prevents the composition shift of the bumps and uneven bumps being formed by utilizing the conventional etchant.

Figure 12:
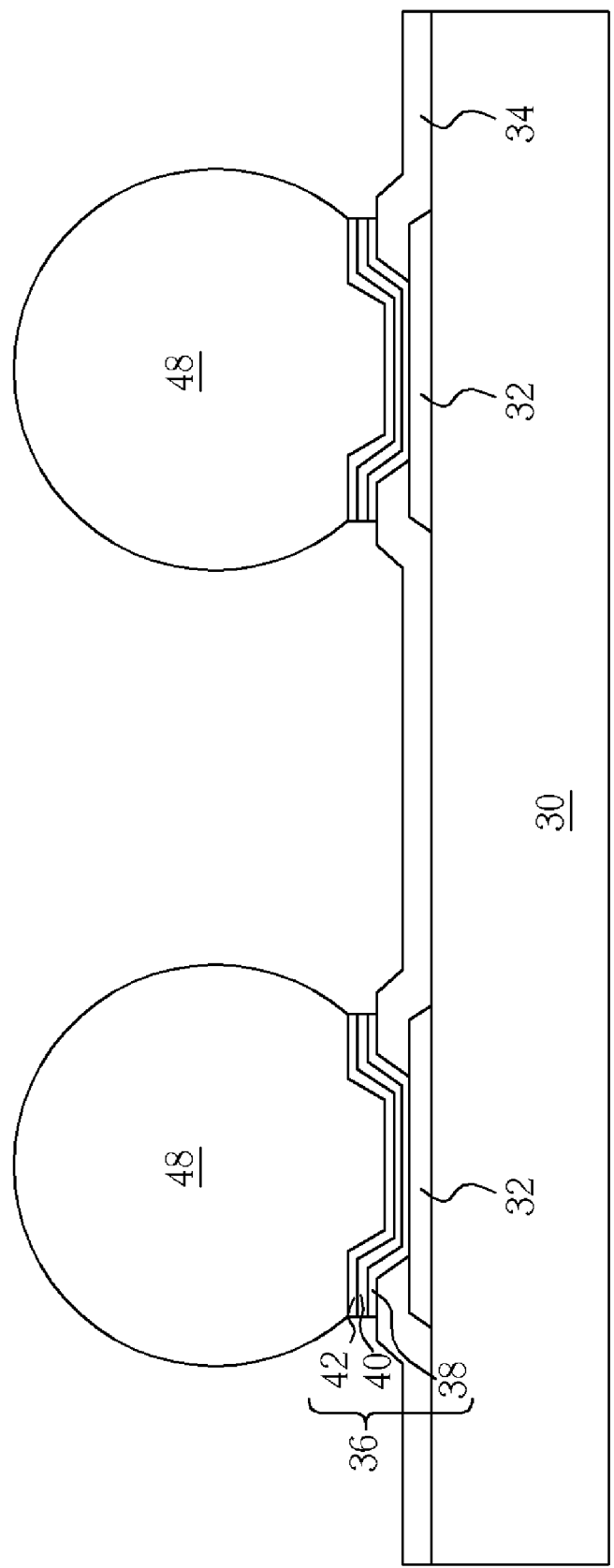

Next, as shown in FIG. 12, a reflow process is performed on the solder 46, such that the solder 46 will expand as a result of surface expansion and form into a plurality of bumps 48 on each corresponding bonding pad 32.

According to the first etchant and second etchant utilized in the preferred embodiment, the present invention further discloses an etchant formula. Preferably, the etchant is selected from the group consisting of: sulfuric acid, phosphoric acid, ferric chloride, ammonium persulfate, potassium monopersulfate, hydrochloric acid, copper stabilizer, chlorine stabilizer, and deionized water. Specifically, the sulfuric acid has a volume percent in concentration between 30% and 35%. The phosphoric acid has a volume percent in concentration between 5% and 8%. The ammonium persulfate has a volume percent in concentration between 8% and 11%. The ferric chloride has a volume percent in concentration between 2% and 10%. The hydrochloric acid has a volume percent in concentration of less than 5%. The copper stabilizer has a volume percent in concentration of 0.5%. The chlorine stabilizer has a volume percent in concentration between 1% and 2%. The deionized water has a volume percent in concentration between 35% and 55%. The potassium monopersulfate has a volume percent in concentration between 8% and 11%.

In contrast to the conventional method of forming bumps, the present invention first utilizes a first etchant composed of sulfuric acid, phosphoric acid, ferric chloride, and ammonium persulfate, or a first etchant composed of sulfuric acid, phosphoric acid, ferric chloride, and potassium monopersulfate to remove a portion of the wetting layer and the barrier layer of the under bump metallurgy layer, and then utilizes a second etchant composed of sulfuric acid and deionized water to remove a portion of the adhesive layer. Thereby, the adhesive layer, barrier layer, and wetting layer of the under bump metallurgy layer can be etched evenly through an adequate etching selectivity. Additionally, the undercut phenomenon caused by using the conventional etchant, which is composed of nitric acid, acetic acid, hydrogen peroxide, hydrochloric acid, and sulfuric acid, to etch the under bump metallurgy layer is also prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming bumps, comprising:
   providing a substrate having an adhesive layer, a barrier layer, and a wetting layer thereon;
   forming a patterned photoresist on the wetting layer, wherein the patterned photoresist comprises at least one opening for exposing a portion of the wetting layer;
   depositing a solder in the opening;
   performing a stripping process to remove the patterned photoresist;
   utilizing a first etchant to perform a first etching process for removing a portion of the wetting layer and the barrier layer by utilizing the solder as a mask, wherein the first etchant comprises sulfuric acid, phosphoric acid, ferric chloride, and ammonium persulfate;
   utilizing a second etchant to perform a second etching process and remove a portion of the adhesive layer; and
   performing a reflow process to form a bump.

2. The method of claim 1, wherein the substrate comprises a wafer.

3. The method of claim 1 further comprising:
   disposing at least one bonding pad on the substrate, wherein the bonding pad electrically connects the circuits within the substrate; and
   forming a patterned passivation layer on the substrate for exposing a portion of the bonding pad.

4. The method of claim 3, wherein the opening is located above the bonding pad.

5. The method of claim 1, wherein the adhesive layer is selected from the group consisting of aluminum, titanium, chromium, and titanium tungsten.

6. The method of claim 1, wherein the barrier layer is selected from the group consisting of nickel and nickel vanadium.

7. The method of claim 1, wherein the wetting layer is selected from the group consisting of copper, molybdenum, and platinum.

8. The method of claim 1, wherein the second etchant is consisting of sulfuric acid and deionized water.

9. A method for forming bumps, comprising:
   providing a substrate having an adhesive layer, a barrier layer, and a wetting layer thereon;
   forming a patterned photoresist on the wetting layer, wherein the patterned photoresist comprises at least one opening for exposing a portion of the wetting layer;
   depositing a solder in the opening;
   performing a stripping process to remove the patterned photoresist;
   utilizing a first etchant to perform a first etching process for removing a portion of the wetting layer and the barrier layer by utilizing the solder as a mask, wherein the first etchant comprises sulfuric acid, phosphoric acid, ferric chloride, and potassium monopersulfate;
   utilizing a second etchant to perform a second etching process and remove a portion of the adhesive layer; and
   performing a reflow process to form a bump.

10. The method of claim 9, wherein the substrate comprises a wafer.

11. The method of claim 9 further comprising:
    disposing at least one bonding pad on the substrate, wherein the bonding pad electrically connects the circuits within the substrate; and
    forming a patterned passivation layer on the substrate for exposing a portion of the bonding pad.

12. The method of claim 11, wherein the opening is located above the bonding pad.

13. The method of claim 9, wherein the adhesive layer is selected from the group consisting of aluminum, titanium, chromium, and titanium tungsten.

14. The method of claim 9, wherein the barrier layer is selected from the group consisting of nickel and nickel vanadium.

15. The method of claim 9, wherein the wetting layer is selected from the group consisting of copper, molybdenum, and platinum.

16. The method of claim 9, wherein the second etchant is consisting of sulfuric acid and deionized water.

* * * * *